United States Patent
Yamamoto et al.

(10) Patent No.: US 7,190,982 B2
(45) Date of Patent: Mar. 13, 2007

(54) RADIO FREQUENCY DEVICE

(75) Inventors: Kouki Yamamoto, Ohtsu (JP); Noriyuki Yoshikawa, Ibaraki (JP); Kazuhiko Ohashi, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 378 days.

(21) Appl. No.: 10/764,537

(22) Filed: Jan. 27, 2004

(65) Prior Publication Data

US 2004/0156178 A1    Aug. 12, 2004

(30) Foreign Application Priority Data

Jan. 28, 2003    (JP)    ............... 2003-018266

(51) Int. Cl.
*H04M 1/00*    (2006.01)
(52) U.S. Cl. ............ 455/575.1; 455/90.1; 455/422.1
(58) Field of Classification Search ........... 455/575.1, 455/575.2, 575.3, 575.4, 575.5, 575.6, 90.1, 455/90.2, 90.3, 422.1, 300, 296, 297, 298, 455/575.9, 550.1; 361/794
See application file for complete search history.

(56) References Cited

U.S. PATENT DOCUMENTS

| | | | | | |
|---|---|---|---|---|---|
| 2,278,094 | A | * | 3/1942 | Pifer | ............ 455/298 |
| 4,740,794 | A | * | 4/1988 | Phillips et al. | ........... 455/575.5 |
| 5,639,989 | A | * | 6/1997 | Higgins, III | ............ 455/550.1 |
| 5,898,344 | A | | 4/1999 | Hayashi | |
| 6,304,458 | B1 | * | 10/2001 | Mendolia | ............ 455/296 |
| 6,687,135 | B1 | | 2/2004 | Kitade | |
| 6,689,670 | B2 | | 2/2004 | Kawanishi | |
| 6,825,411 | B2 | * | 11/2004 | Pommerenke et al. | ...... 361/794 |
| 2001/0053070 | A1 | | 12/2001 | Kitamura et al. | |
| 2006/0046779 | A1 | * | 3/2006 | Tracy et al. | ............ 455/585.1 |
| 2006/0052064 | A1 | * | 3/2006 | Goradesky | ............... 455/90.3 |

FOREIGN PATENT DOCUMENTS

| | | |
|---|---|---|
| JP | 3065295 | 3/1991 |
| JP | 7263892 | 10/1995 |
| JP | 9116091 | 5/1997 |

(Continued)

OTHER PUBLICATIONS

Japanese Office Action dated Jul. 3, 2006 with English translation.

(Continued)

*Primary Examiner*—Lana Le
(74) *Attorney, Agent, or Firm*—Stevens, Davis, Miller & Mosher, LLP

(57) ABSTRACT

In the present radio frequency device, a radio frequency circuit part and a transmission line are disposed on the top surface of a circuit board on the surface of which a ground pattern is provided, and a metal shielding cap is fixed to the circuit board so as to cover the radio frequency circuit part and the transmission path. The metal shielding cap includes: a top plate disposed above the radio frequency circuit part and substantially parallel to the circuit board; a grounded side wall being provided so as to hang down from a part of an edge of the top plate, having a spring property and being joined to the ground pattern of the circuit board, and a side wall is open except for the grounded side wall.

4 Claims, 9 Drawing Sheets

FOREIGN PATENT DOCUMENTS

| | | | |
|---|---|---|---|
| JP | 9307261 | | 11/1997 |
| JP | 11220226 | | 8/1999 |
| JP | 2001 015976 | | 1/2001 |
| JP | 2001-148594 | * | 5/2001 |
| JP | 2001 148594 | | 5/2001 |
| JP | 2001 352272 | | 12/2001 |
| JP | 2002 009478 | | 1/2002 |
| JP | 2002-009478 | * | 1/2002 |
| JP | 2002 057234 | | 2/2002 |
| JP | 2002 084057 | | 3/2002 |
| JP | 2002 170894 | | 6/2002 |
| JP | 2002-185256 | * | 6/2002 |
| JP | 2002 185256 | | 6/2002 |
| JP | 2003 318591 | | 11/2003 |
| JP | 2004 022711 | | 1/2004 |
| JP | 2004 031744 | | 1/2004 |
| JP | 2004 031787 | | 1/2004 |

OTHER PUBLICATIONS

Japanese Office Action dated Mar. 9, 2006 with English translation.
Patent Abstracts of Japan, Publication No. 200422711A, Jan. 22, 2004.

* cited by examiner

Distance between metal shielding cap and chip inductor (mm)

RADIO FREQUENCY DEVICE

BACKGROUND OF THE INVENTION

1. Field of the Invention

The present invention relates to a radio frequency device having a metal shielding cap structure.

2. Description of the Prior Art

In recent years, information communications have played an extremely important part, and demands for mobile communication systems have rapidly been increasing. Under such circumstances, for mobile telephones and cordless telephones, because of demands for system miniaturization, it is becoming extremely important to miniaturize devices constituting a radio frequency circuit block.

Conventionally, as a radio frequency device which is one of the devices in a radio frequency circuit block of a portable telephone employing the PDC (personal digital cellular) system, in particular an amplifying device as a radio frequency amplifier for transmission, a gallium arsenide field effect transistor is used because of its excellent radio frequency characteristics.

FIG. 7 shows an example of the cross-sectional structure of a prior art radio frequency device (for example, see Japanese Laid-Open Patent Application No. H11-220226, pp. 3–5, FIGS. 1 and 7). In this radio frequency device, for example, a gallium arsenide field effect transistor 3 is mounted in a concave portion on the reverse surface of dielectric multilayer circuit board 2 being, for example, rectangular, and the transistor 3 is encapsulated in a resin 9. Radio frequency circuit parts 5 mounted on land patterns 10 on the surface of the dielectric multilayer circuit board 2 (the upside in FIG. 7), and a strip line 6 constitute a radio frequency matching circuit of the transistor 3. The radio frequency circuit parts 5 on the surface of the dielectric multilayer circuit board 2 (the upside in FIG. 7), and a microstrip line 7 constitute an electric circuit of the transistor 3. These circuits are interconnected by a via hole 8 in an inner layer formed by an electric conductor such as a conductive paste being filled in a minute hole for a via hole, and this forms a radio frequency microwave circuit.

The radio frequency circuit parts 5 and the strip line 6 on the surface of the dielectric multilayer circuit board 2 are shielded by a metal shielding cap 1. The metal shielding cap 1 is electrically joined to a ground pattern 4 present at an end of the top surface or at the side of the dielectric multilayer circuit board 2 by soldering, welding or the like. The ground pattern 4 is also present on the reverse surface of the dielectric multilayer circuit board.

FIG. 8 shows distances required of the design because of positional displacements and dimensional deviations of the metal shielding cap 1, the dielectric multilayer circuit board 2, the radio frequency circuit parts 5 and the land pattern 10 in the prior art radio frequency device.

Here, a structure is shown such that the side walls of the metal shielding cap 1 are placed on the ends of the top surface of the dielectric multilayer circuit board 2. As the dielectric material of the dielectric multilayer circuit board 2, in view of heat radiation, alumina that is excellent in thermal conductivity is frequently used. To form the land pattern 10 where the radio frequency circuit parts 5 are mounted and the strip line 6 on the surface of the dielectric multilayer circuit board 2, the following procedure is taken: A thick film conductor with copper as the main constituent is screen-printed on green sheets formed of the dielectric material, these are laid one on another and crimped, and the dielectric and the conductor are baked, whereby the above-described structure is completed.

However, in the steps of printing, crimping and baking, the positions of the land pattern 10 for mounting the radio frequency circuit parts 5 and the strip line 6 are displaced by a maximum of 0.100 mm (the dimension D in FIG. 8) with respect to the design CAD drawing dimension. Moreover, the following displacements and deviations are present: an outer dimension deviation of a maximum of 0.100 mm (the dimension A in FIG. 8) caused when the dielectric multilayer circuit board 2 after the baking is divided into pieces; a mounting position displacement of the radio frequency circuit parts 5 of a maximum of 0.150 mm (the dimension E in FIG. 8); an outer dimension deviation of the metal shielding cap 1 of a maximum of 0.050 mm (the dimension B in FIG. 8); and a positional displacement of a maximum of 0.150 mm (the dimension C in FIG. 8) caused when the metal shielding cap 1 is soldered or welded to the dielectric multilayer circuit board 2.

For this reason, in the conventional metal shielding cap structure, from the relationship between the mounting position accuracies of the radio frequency circuit parts 5 and the metal shielding cap 1 and the dimensional accuracies of the dielectric multilayer circuit board 2 and the metal shielding cap 1, a predetermined distance 0.550 mm (the dimension F in FIG. 8) is required to prevent the radio frequency circuit parts 5 and the metal shielding cap 1 from being in contact with each other, and this has been an obstacle to miniaturization.

Likewise, in the prior art metal shielding cap structure, from the relationship among the positional accuracy of the strip line 6, the mounting position accuracy of the metal shielding cap 1 and the dimensional accuracies of the dielectric multilayer circuit board 2 and the metal shielding cap 1, a predetermined distance 0.450 mm is required to prevent the strip line 6 and the metal shielding cap 1 from being in contact with each other, and this has been an obstacle to miniaturization.

Further, the presence of these positional displacements and dimensional deviations means that the distance between the radio frequency circuit part 5 and the metal shielding cap 1 cannot be maintained constant, and the above-mentioned displacements and deviations affect the impedances of the radio frequency circuit parts 5. This affects the radio frequency matching of the transistor, and degrades the characteristics of the radio frequency device.

Moreover, in a structure where the side walls of the metal shielding cap 1 and the ground patterns on the side surfaces of the dielectric multilayer circuit board 2 are soldered or welded to thereby join the metal shielding cap 1 and the dielectric multilayer circuit board 2 together, the following problem arises: When there is a deviation between the dimensions of the metal shielding cap 1 and the outer dimensions of the dielectric multilayer circuit board 2, the metal shielding cap 1 does not fit on the dielectric multilayer circuit board 2, or a float (gap) is caused at the junction between the metal shielding cap 1 and the dielectric multilayer circuit board 2 to cause a contact failure.

SUMMARY OF THE INVENTION

In view of these points, an object of the present invention is to provide a radio frequency device capable of being miniaturized without any degradation in radio frequency characteristics and capable of making excellent the junction between the metal shielding cap and the dielectric multilayer circuit board.

A radio frequency device according to a first aspect of the invention comprises: a circuit board having a ground pattern on a surface thereof; a radio frequency circuit part and a transmission line disposed on a top surface of the circuit board; and a metal shielding cap fixed to the circuit board so as to cover the radio frequency circuit part and the transmission line. The metal shielding cap comprises: a top plate disposed above the radio frequency circuit part and substantially parallel to the circuit board; and a grounded side wall being provided so as to hang down from a part of an edge of the top plate, having a spring property and being joined to the ground pattern of the circuit board so as to be electrically connected thereto, and a side wall of the metal shielding cap is open except for the grounded side wall.

According to this structure, on the side surface of the metal shielding cap, although the grounded side wall is partly provided, the part other than the grounded side wall is open and no side wall is provided. Consequently, with respect to the open part of the side surface of the metal shielding cap, it is unnecessary to consider the outer dimension deviation of the metal shielding cap and the positional displacement caused when the metal shielding cap is fixed to the circuit board. Therefore, the mountable region of the radio frequency circuit part, the transmission line or the like on the surface of the circuit board can be increased. Consequently, the circuit board can be reduced in size, so that the radio frequency device can be miniaturized. Moreover, the dimensional error between the metal shielding cap and the circuit board can be absorbed by the plate spring effect of the grounded sidewall, so that the junction between the metal shielding cap and the circuit board can be made excellent.

Moreover, a radio frequency device according to a second aspect of the invention comprises: a circuit board having a ground pattern on a surface thereof; a radio frequency circuit part and a transmission line disposed on a top surface of the circuit board; and a metal shielding cap fixed to the circuit board so as to cover the radio frequency circuit part and the transmission line. The metal shielding cap comprises: a top plate disposed above the radio frequency circuit part and substantially parallel to the circuit board; a grounded side wall being provided so as to hang down from a part of an edge of the top plate, having a spring property and being joined to the ground pattern of the circuit board so as to be electrically connected thereto; and a non-grounded side wall provided so as to adjoin the grounded side wall, to hang down from another part of the edge of the top plate and to be shorter than the grounded side wall, a notch opened downward is provided at a boundary between the grounded side wall and the non-grounded side wall, and a side wall is open except for the grounded side wall and the non-grounded side wall.

According to this structure, on the side surface of the metal shielding cap, although the grounded side wall and the non-grounded side wall are partly provided, the part other than the grounded side wall and the non-grounded side wall is open and no side wall is provided. Consequently, with respect to the open part of the side surface of the metal shielding cap, it is unnecessary to consider the outer dimension deviation of the metal shielding cap and the positional displacement caused when the metal shielding cap is fixed to the circuit board. Therefore, the mountable region of the radio frequency circuit part, the transmission line or the like on the surface of the circuit board can be increased. Consequently, the circuit board can be reduced in size, so that the radio frequency device can be miniaturized.

Moreover, the dimensional error between the metal shielding cap and the circuit board can be absorbed by the plate spring effect of the grounded side wall, so that the junction between the metal shielding cap and the circuit board can be made excellent.

In the above-described radio frequency device according to the second aspect of the invention, it is preferable that the non-grounded side wall have a length larger than a height of the radio frequency circuit part and that the grounded side wall be joined to the ground pattern of the circuit board with a lower end of the non-grounded side wall abutting on the top surface of the circuit board.

According to this structure, the non-grounded side wall of the metal shielding cap serves as a support, so that the strength of the metal shielding cap against forces from the direction of the top surface of the metal shielding cap can be increased, and the metal shielding cap can be prevented from being deformed by external forces to be in contact with the radio frequency circuit part.

Moreover, in the above-described radio frequency device according to the second aspect of the invention, it is preferable that the opened part of a side surface of the metal shielding cap have a height and width set so that the metal shielding cap is not in contact with the radio frequency circuit part disposed on the circuit board.

According to this structure, the radio frequency circuit part can be disposed in the opened part of the side surface of the metal shielding cap, so that the radio frequency circuit part mountable region on the surface of the circuit board can be increased and the radio frequency device can be miniaturized.

When the opened part of the side surface of the metal shielding cap has a height and width set so that the metal shielding cap is not in contact with the radio frequency circuit part disposed on the circuit board as described above, it is preferable that the opened part of the side surface of the metal shielding cap be arch-shaped.

According to this structure, since the opened part of the side surface is arch-shaped, the decrease in the strength of the metal shielding cap by the opening of the part of the side surface of the metal shielding cap can be suppressed. Consequently, increase in the number of radio frequency circuit parts mounted on the circuit board or miniaturization of the radio frequency device can be realized while the strength against forces from the direction of the top surface of the metal shielding cap is maintained.

Moreover, when the opened part of the side surface of the metal shielding cap has a height and width set so that the metal shielding cap is not in contact with the radio frequency circuit part disposed on the circuit board as described above, it is preferable that a radio frequency circuit part whose impedance is sensitively affected by a distance from the metal shielding cap be disposed in the opened part of the side surface of the metal shielding cap.

According to this structure, degradation of the radio frequency characteristics of the radio frequency circuit part due to an electromagnetic interference of the metal shielding cap can be minimized.

Moreover, when the opened part of the side surface of the metal shielding cap has a height and width set so that the metal shielding cap is not in contact with the radio frequency circuit part disposed on the circuit board as described above, it is preferable that a radio frequency circuit part for low power through which a low radio frequency signal power flows be disposed in a position in a proximity of the opened part of the side surface of the metal shielding cap and that a radio frequency circuit part for high power through which a high radio frequency signal power flows be disposed in a position in a proximity of the non-opened part of the side surface of the metal shielding cap.

According to this structure, by designing the circuit so that the radio frequency circuit part for low power through which a low radio frequency signal power flows is disposed in the opened part of the metal shielding cap and that the radio frequency circuit part for high power through which a high radio frequency signal power flows is disposed in the non-opened part of the side surface of the metal shielding cap, miniaturization can be realized while the shielding characteristic the same as that of the prior art radio frequency device is maintained.

In the above-described radio frequency device according to the second aspect of the invention, it is preferable that the opened part of the side surface of the metal shielding cap have a height and width set so that the metal shielding cap is not in contact with the transmission line disposed on the circuit board.

According to this structure, since the opened part of the side surface of the metal shielding cap has a height and width set so that the metal shielding cap is not in contact with the transmission line disposed on the circuit board, the region where the transmission line is placed on the surface of the circuit board can be increased and the radio frequency device can be miniaturized. In the case of the transmission line, it is necessary that the height of the opened part of the side surface of the metal shielding cap be only approximately 0.050 to 0.150 mm smaller than the height of the radio frequency circuit part.

As described above, according to the radio frequency device of the present invention, by opening a part of the side surface of the metal shielding cap, the ratio of the area occupied by the radio frequency circuit parts and the transmission lines that can be placed on the surface of the circuit board can be increased, and miniaturization of the radio frequency device can be realized.

Moreover, by designing the circuit so that the radio frequency circuit parts are disposed in optimum positions in accordance with the presence or absence of the side surface of the metal shielding cap, the characteristics can be made more stable, or miniaturization of the radio frequency device can be realized without the shielding characteristic being degraded.

Moreover, since the grounded side wall is caused to function as a plate spring by partly forming a side wall or providing a notch at the boundary between the grounded side wall and the non-grounded side wall, even if there is a dimensional deviation between the circuit board and the metal shielding cap, the dimensional deviation can be absorbed

DESCRIPTION OF THE PREFERRED EMBODIMENTS (First Embodiment)

Figure 1:
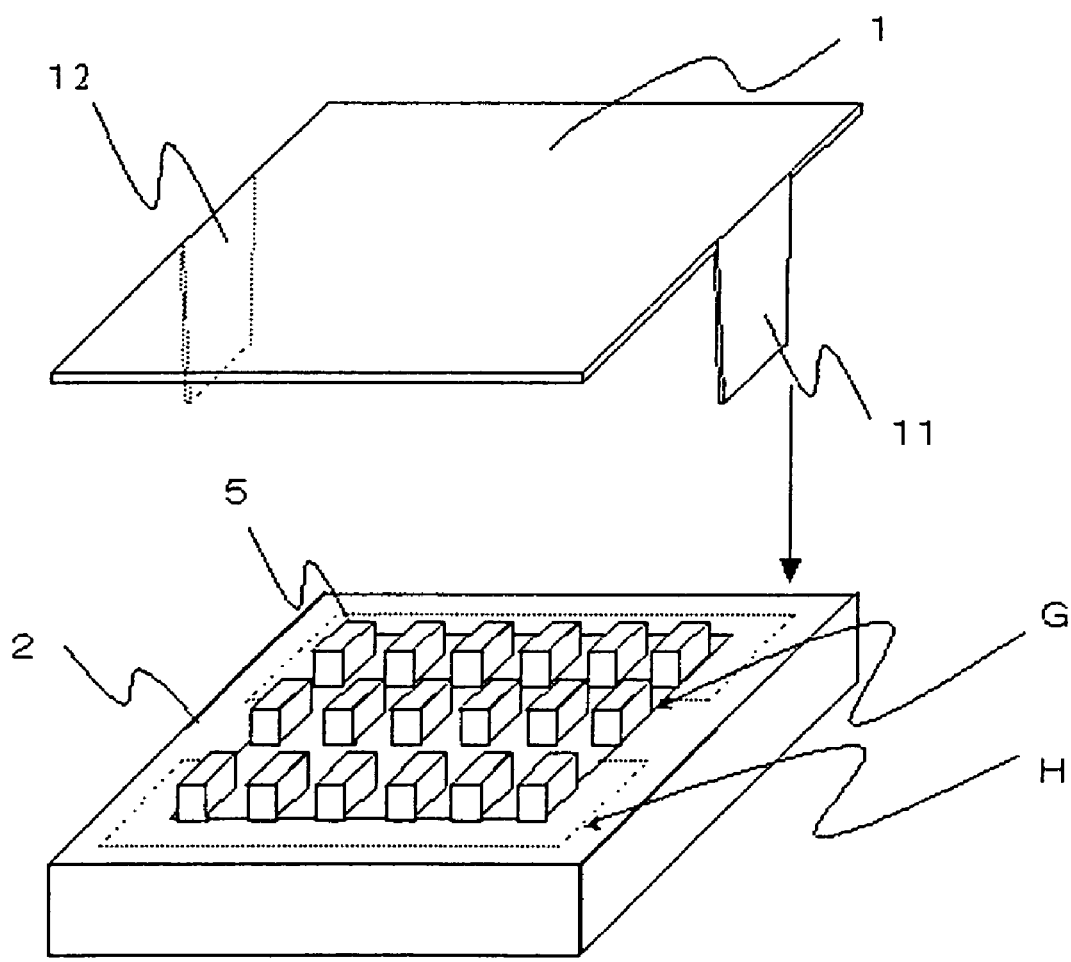
FIG. 1 is a schematic view showing an example of a radio frequency device according to a first embodiment of the present invention.
Figure 7:
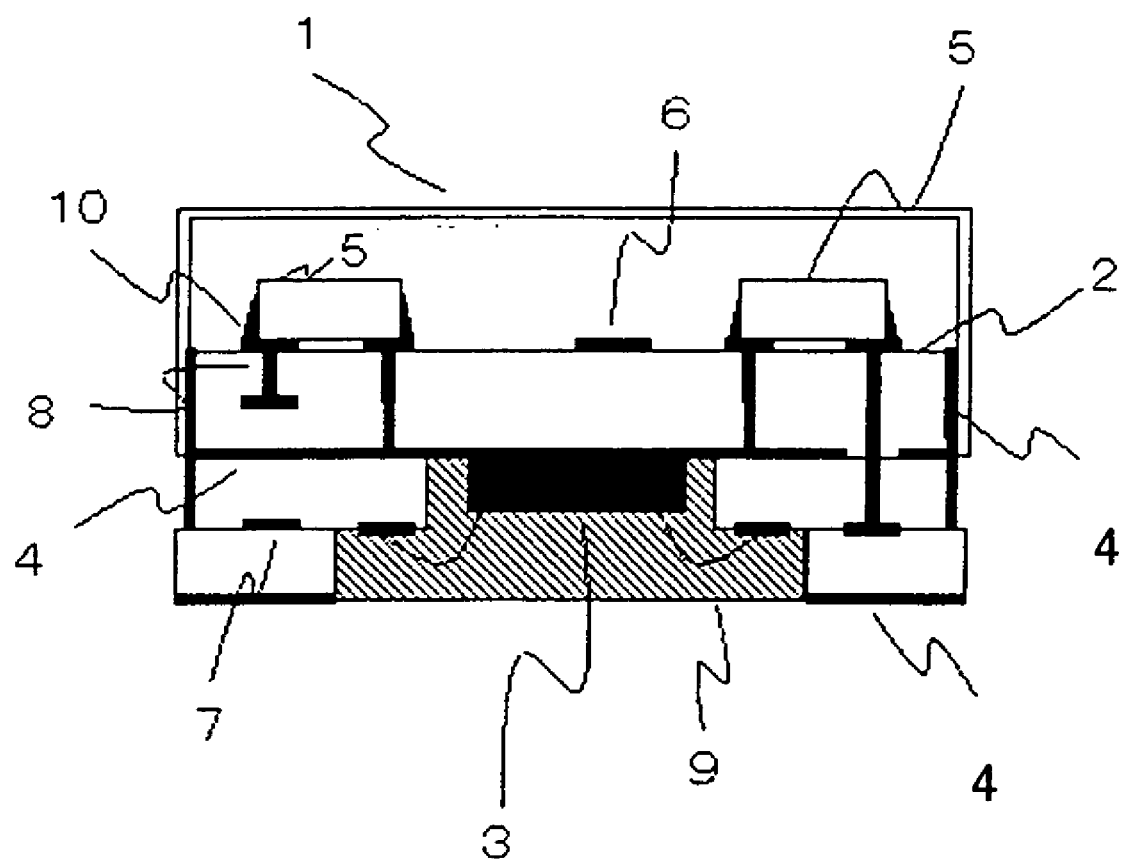
FIG. 7 is a cross-sectional view showing the example of the prior art radio frequency device.
Figure 8:
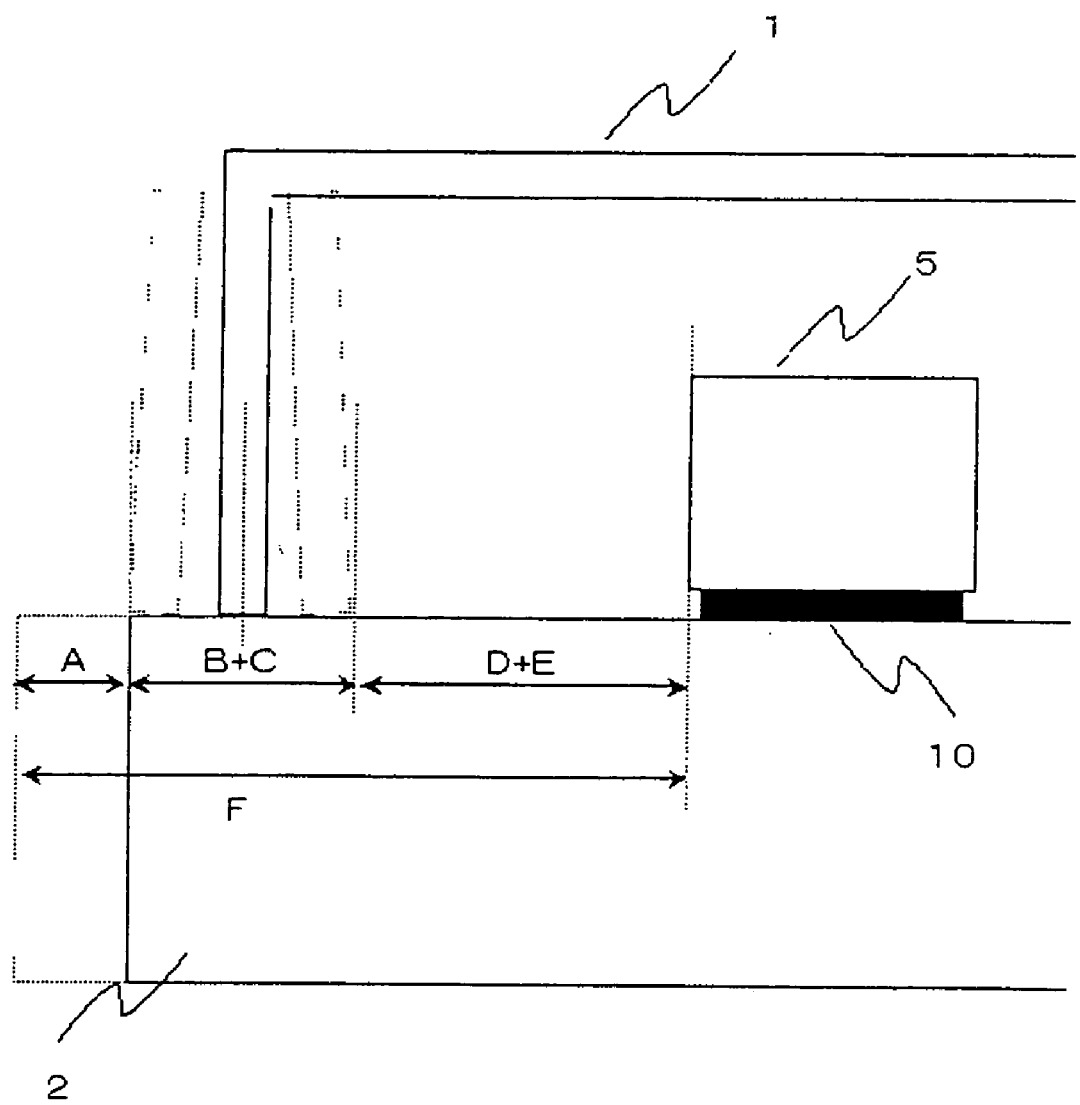
FIG. 8 is an enlarged cross-sectional view of the prior art radio frequency device.

FIG. 1 shows an example of the structure of a radio frequency device according to a first embodiment of the present invention. As shown in FIG. 1, this radio frequency device comprises: a dielectric multilayer circuit board 2 being, for example, rectangle, being made of, for example, alumina and on the surfaces of which ground patterns (see FIG. 7) are formed; radio frequency circuit parts 5 and a transmission line (see FIG. 7) disposed on the top surface of the dielectric multilayer circuit board 2; and a metal shielding cap 1 made of, for example, nickel.

The metal shielding cap 1 is formed by bending, pressing or the like, and comprises, for example, a top plate 12 being, for example, rectangular and grounded side walls 11. The side surfaces are open except for the grounded side walls 11. The top plate 12 is disposed above the radio frequency circuit parts 5 and substantially parallel to the dielectric multilayer circuit board 2. The grounded side walls 11 are each provided so as to hang down from a part, a central part in this example, of each of two opposing sides of the four edges of the top plate 12, have a spring property, and are joined to a ground pattern on the dielectric multilayer circuit board 2 so as to be electrically connected thereto. A predetermined gap is provided between the top plate 12 and the top surfaces of the radio frequency circuit parts 5.

More specifically, in this radio frequency device, the grounded side walls 11 of the metal shielding cap 1 are electrically and mechanically joined to the ground pattern (see FIG. 7) provided at the side of (surface) of the dielectric multilayer circuit board 2 being, for example, rectangular. The four side walls of the metal shielding cap 1 are removed except for the pair of grounded side walls 11 for grounding. The grounded side walls 11 of the metal shielding cap 1 are fixed to the ground pattern provided at the side of the dielectric multilayer circuit board 2 by soldering or welding.

With this, a space for placing the radio frequency circuit parts 5 is secured between the dielectric multilayer circuit board 2 and the metal shielding cap 1. This enables the radio frequency circuit part 5 mountable region on the top surface of the dielectric multilayer circuit board 2 to be increased in the part of the metal shielding cap 1 where no grounded side wall 11 is present, so that the radio frequency device can be miniaturized. In FIG. 1, the solid line G indicates the radio frequency circuit part mountable region in the prior art, and the broken line H indicates the radio frequency circuit part mountable region increased by the first embodiment. FIG. 1 shows the condition before the metal shielding cap 1 is fixed to the dielectric multilayer circuit board 2. After the metal shielding cap 1 is fixed to the dielectric multilayer circuit board 2, the cross-sectional condition is similar to that shown in FIG. 7 in the part where these are connected together.

That is, on the side surfaces of the metal shielding cap 1, although the grounded side walls 11 are partly provided, no side wall is provided on the other part. Consequently, with respect to the part where no side wall is provided, that is, the open part of the side surfaces of the metal shielding cap 1, it is unnecessary to consider the outer dimension deviation of the metal shielding cap 1 and the positional displacement caused when the metal shielding cap 1 is fixed to the dielectric multilayer circuit board 2 in order to prevent the radio frequency circuit parts 5 or the transmission line and the metal shielding cap 1 from being in contact with each other. Therefore, the radio frequency circuit part 5 or transmission line mountable region on the surface of the dielectric multilayer circuit board 2 can be increased. Consequently, the dielectric multilayer circuit board 2 can be reduced in size, so that the radio frequency device can be miniaturized.

While in the prior art radio frequency device, it is necessary to provide a distance of 0.550 mm between the side of the dielectric multilayer circuit board 2 and the land pattern 10, in the first embodiment of the present invention, only a distance of 0.350 mm is necessarily provided between the side of the dielectric multilayer circuit board 2 and the land pattern 10.

Moreover, by providing the grounded side walls 11 with the structure shown in FIG. 1, the grounded side walls 11 can be caused to function as plate springs and can be made resilient. Consequently, even if there is a dimensional deviation between the dielectric multilayer circuit board 2 and the metal shielding cap 1, the dimensional deviation can be absorbed by the bending effect of the plate springs. That is, the dimensional error between the metal shielding cap 1 and the dielectric multilayer circuit board 2 can be absorbed by the plate spring effect of the side walls 11, so that the junction between the metal shielding cap 1 and the dielectric multilayer circuit board 2 can be made excellent.

As described above, according to the radio frequency device of the first embodiment of the present invention, by using the metal shielding cap 1 having no side wall except the grounded side walls 11 for junction to the ground pattern on the dielectric multilayer circuit board 2, increase in the number of radio frequency circuit parts 5 or the like mounted on the dielectric multilayer circuit board 2 or miniaturization of the radio frequency device is realized, and the dimensional deviation between the dielectric multilayer circuit board 2 and the metal shielding cap 1 can be absorbed.

(Second Embodiment)

Figure 2:
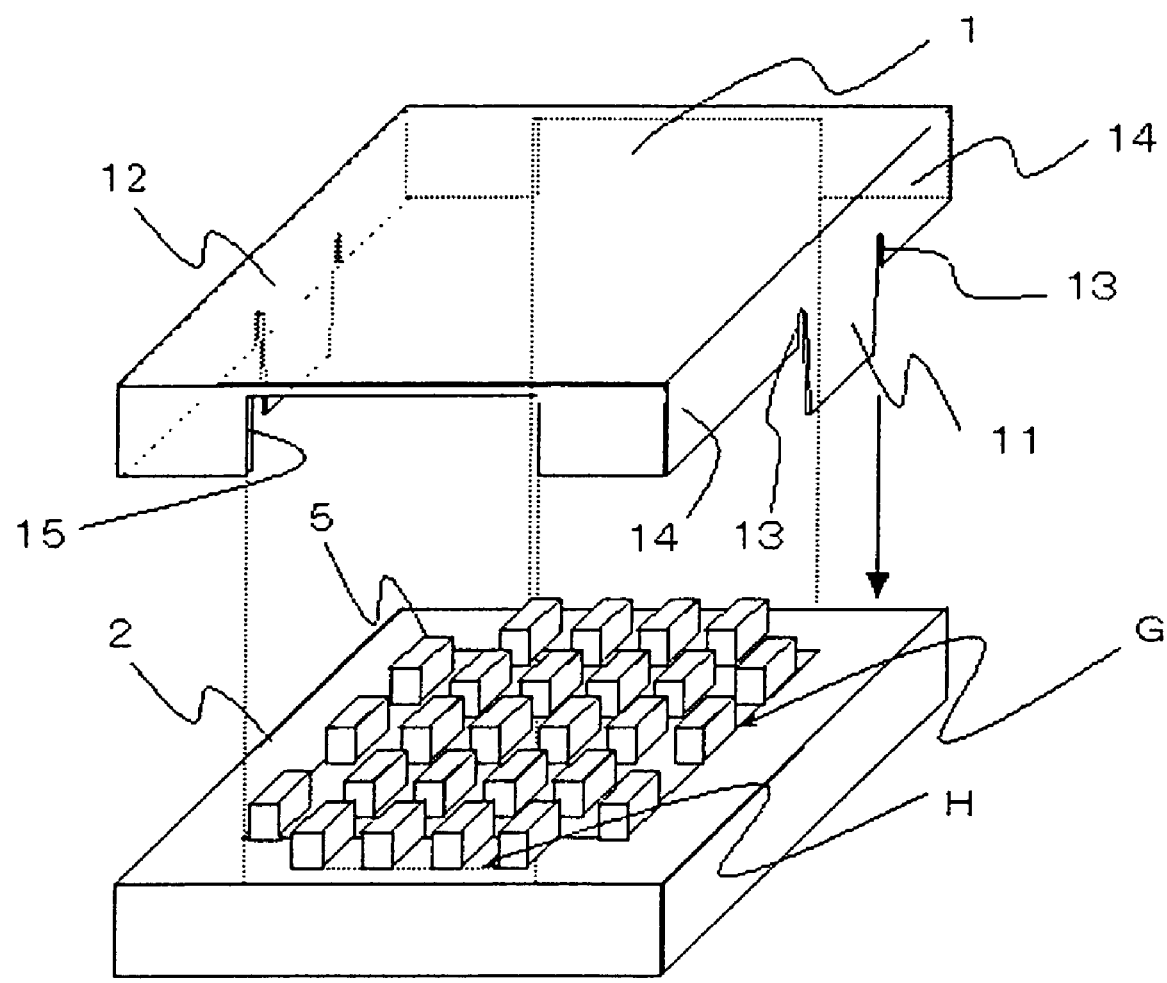
FIG. 2 is a schematic view showing a first example of a radio frequency device according to a second embodiment of the present invention.

FIG. 2 shows an example of the structure of a radio frequency device according to a second embodiment of the present invention. As shown in FIG. 2, this radio frequency device comprises: a dielectric multilayer circuit board 2 being, for example, rectangle, being made of, for example, alumina and on the surfaces of which ground patterns (not shown) are formed; radio frequency circuit parts 5 and a transmission line (not shown) disposed on the top surface of the dielectric multilayer circuit board 2; and a metal shielding cap 1 made of, for example, nickel.

The metal shielding cap 1 is formed by bending or pressing, and comprises a top plate 12 being, for example, rectangular, grounded side walls 11 and non-grounded side walls 14. Notches 13 which are opened downward are provided at the boundary between the grounded side walls 11 and the non-grounded side walls 14, and the side surfaces are open except for the grounded side walls 11 and the non-grounded side walls 14. The top plate 12 is disposed above the radio frequency circuit parts 5 and substantially parallel to the dielectric multilayer circuit board 2. The grounded side walls 11 are each provided so as to hang down from a part, a central part in this example, of each of two opposing sides of the four edges of the top plate 12, have a spring property, and are joined to a ground pattern on the dielectric multilayer circuit board 2 so as to be electrically connected thereto. The non-grounded side walls 14 are provided so as to adjoin both sides of the grounded side walls 11, to hang down from the other part of the edges of the top plate 12 and to be shorter than the grounded side walls 11.

More specifically, in this radio frequency device, the grounded side walls 11 of the metal shielding cap 1 are electrically and mechanically joined to the ground pattern (see FIG. 7) provided at the side (surface) of the dielectric multilayer circuit board 2 being, for example, rectangular. In the metal shielding cap 1, the grounded side walls 11 are each provided so as to hang down from the central part of each of the opposing two sides of the four edges of the top plate 12 being, for example, rectangular, and the non-grounded side walls 14 are provided on both sides thereof with the notches 13 in between. The non-grounded side walls 14 are formed so as to extend around the corners to the other two sides of the top plate 12. In a central part of each of the other two sides of the top plate 12, an open part 15 is provided having a width and height set so that the metal shielding cap 1 is not in contact with the radio frequency circuit parts 5. A predetermined distance is provided between the top plate 12 and the radio frequency circuit parts 5.

The grounded side walls 11 of the metal shielding cap 1 are fixed being joined to the ground pattern on the dielectric multilayer circuit board 2 by soldering or welding, and a space for placing the radio frequency circuit parts 5 is secured between the dielectric multilayer circuit board 2 and the metal shielding cap 1.

Moreover, in the metal shielding cap 1, the length of the non-grounded side walls 14 is larger than the height of the radio frequency circuit parts 5 and the lower ends of the non-grounded side walls 14 are made to abut on the top surface at the edges of the dielectric multilayer circuit board 2, whereby the non-grounded side walls 14 function as supports. These supports are for securing on the space for placing the radio frequency circuit parts 5 between the dielectric multilayer circuit board 2 and the metal shielding cap 1. With this, the strength against forces from the direction of the top surface of the metal shielding cap 1 can be increased. Consequently, the metal shielding cap 1 can be prevented from being deformed by external forces to be in contact with the radio frequency circuit parts.

As shown in FIG. 2, the open parts 15 are such that parts of the non-grounded side walls 14 of the metal shielding cap 1 are opened so that the metal shielding cap 1 is not in contact with the radio frequency circuit parts 5, and by disposing the open parts 15 in the center of the side surfaces of the metal shielding cap 1 and partly leaving the non-grounded side walls 14 on both sides thereof, increase in the foot print of the radio frequency circuit part 5 and improvement in the package strength of the radio frequency device can be realized. When there is a demand for further miniaturization of the radio frequency device, this can be realized by enlarging the open parts 15 of the non-grounded side walls 14 of the metal shielding cap 1.

Moreover, by providing the notches 13 in the grounded side walls 11 as shown in FIG. 2, the side walls can be caused to function as plate springs to thereby obtain resilience, and even if there is a dimensional deviation between the dielectric multilayer circuit board 2 and the metal shielding cap 1, the dimensional deviation can be absorbed by the bending effect of the plate springs. In FIG. 2, the solid line G indicates the radio frequency circuit part mountable region in the prior art, and the broken line H indicates the radio frequency circuit part mountable region increased by the second embodiment. FIG. 2 shows the condition before the metal shielding cap 1 is fixed to the dielectric multilayer circuit board 2. After the metal shielding cap 1 is fixed to the dielectric multilayer circuit board 2, the cross-sectional condition is similar to that shown in FIG. 7 in the part where these are connected together.

Moreover, according to the second embodiment of the present invention, by opening the central parts of the side surfaces of the metal shielding cap 1 so that the radio frequency circuit parts 5 are not in contact and providing the non-grounded side walls 14 on both sides thereof, increase in the number of radio frequency circuit parts 5 mounted on the dielectric multilayer circuit board 2 or miniaturization of the radio frequency device and improvement in the package strength of the radio frequency device can be realized like in the first embodiment. Moreover, by providing the notches 13 at the boundary between the grounded side walls 11 and the non-grounded side walls 14, the dimensional deviation between the dielectric multilayer circuit board 2 and the metal shielding cap 1 can be absorbed.

Figure 3:
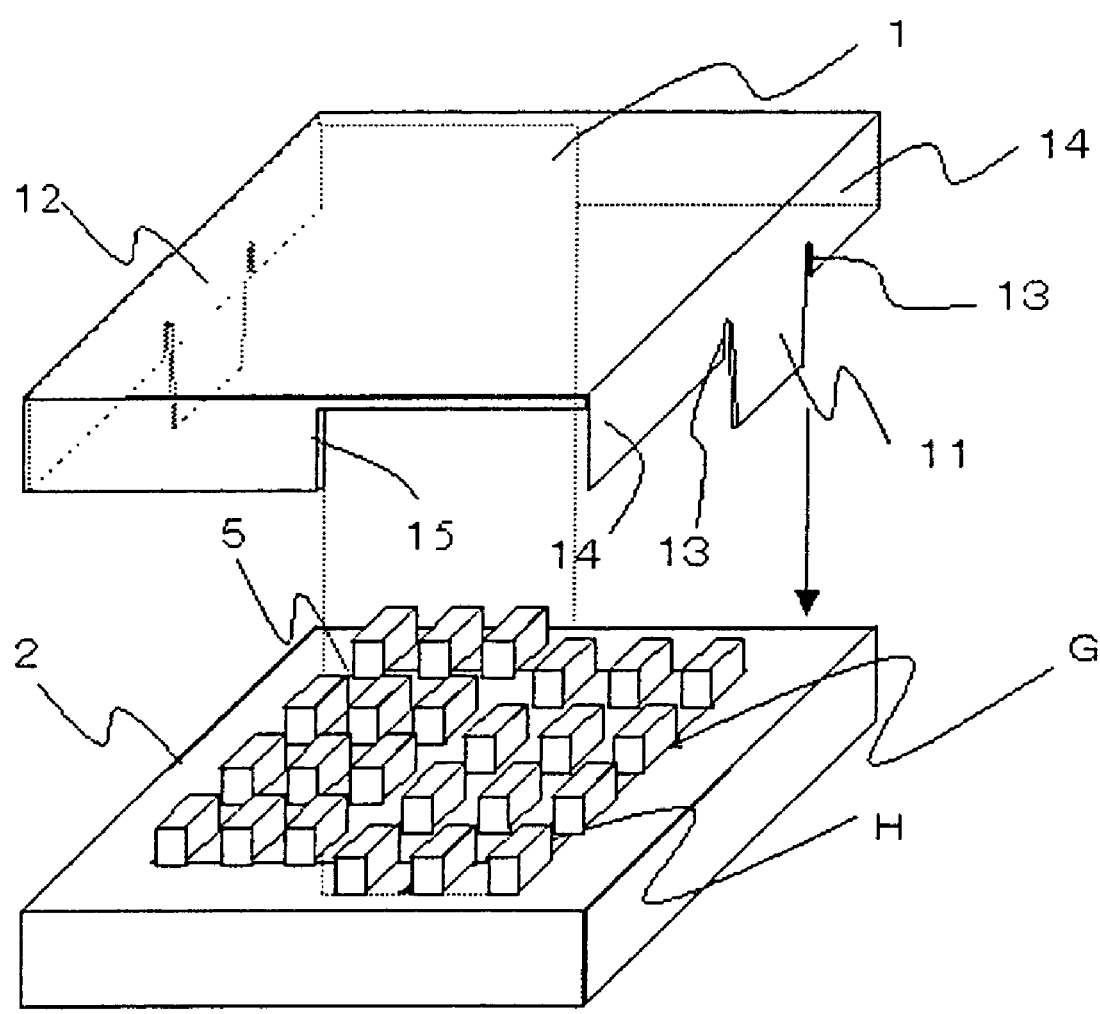
FIG. 3 is a schematic view showing a second example of the radio frequency device according to the second embodiment of the present invention.
Figure 4:
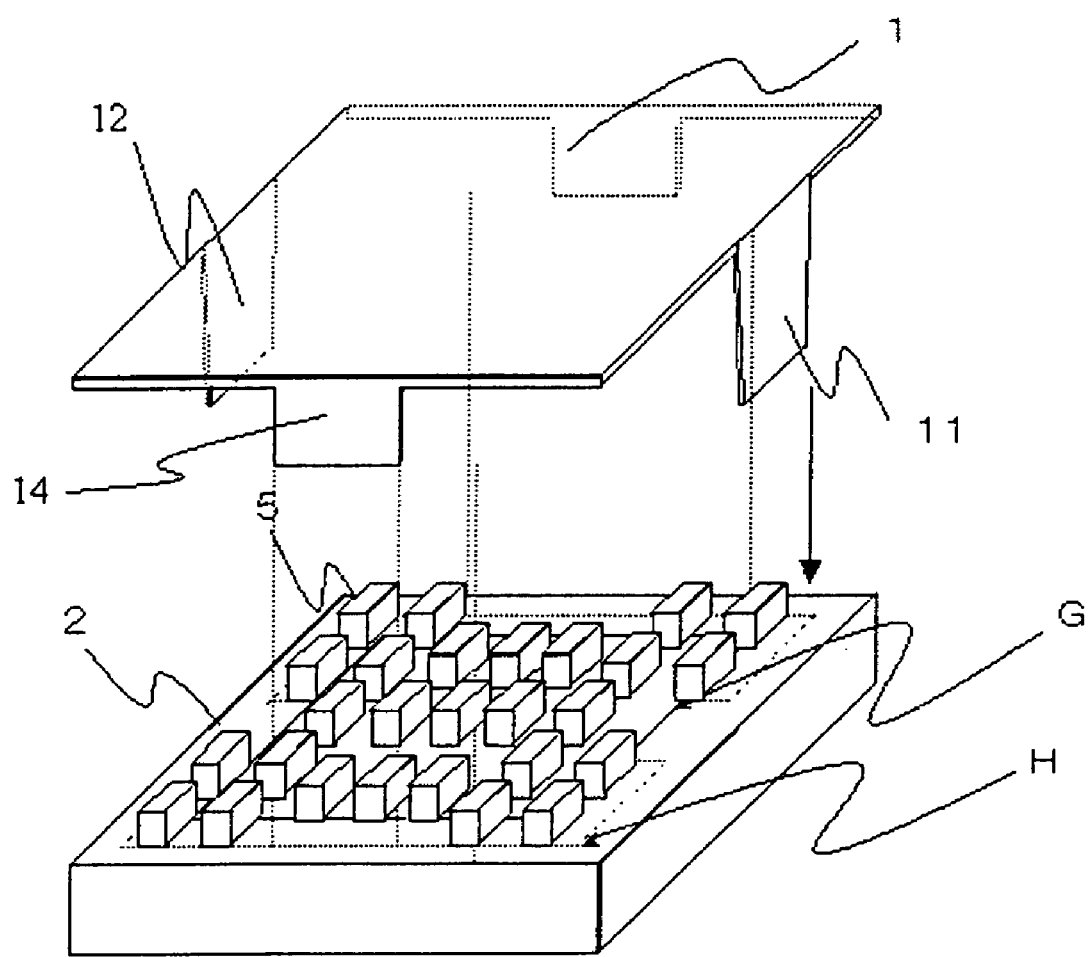
FIG. 4 is a schematic view showing a third example of the radio frequency device according to the second embodiment of the present invention.
Figure 5:
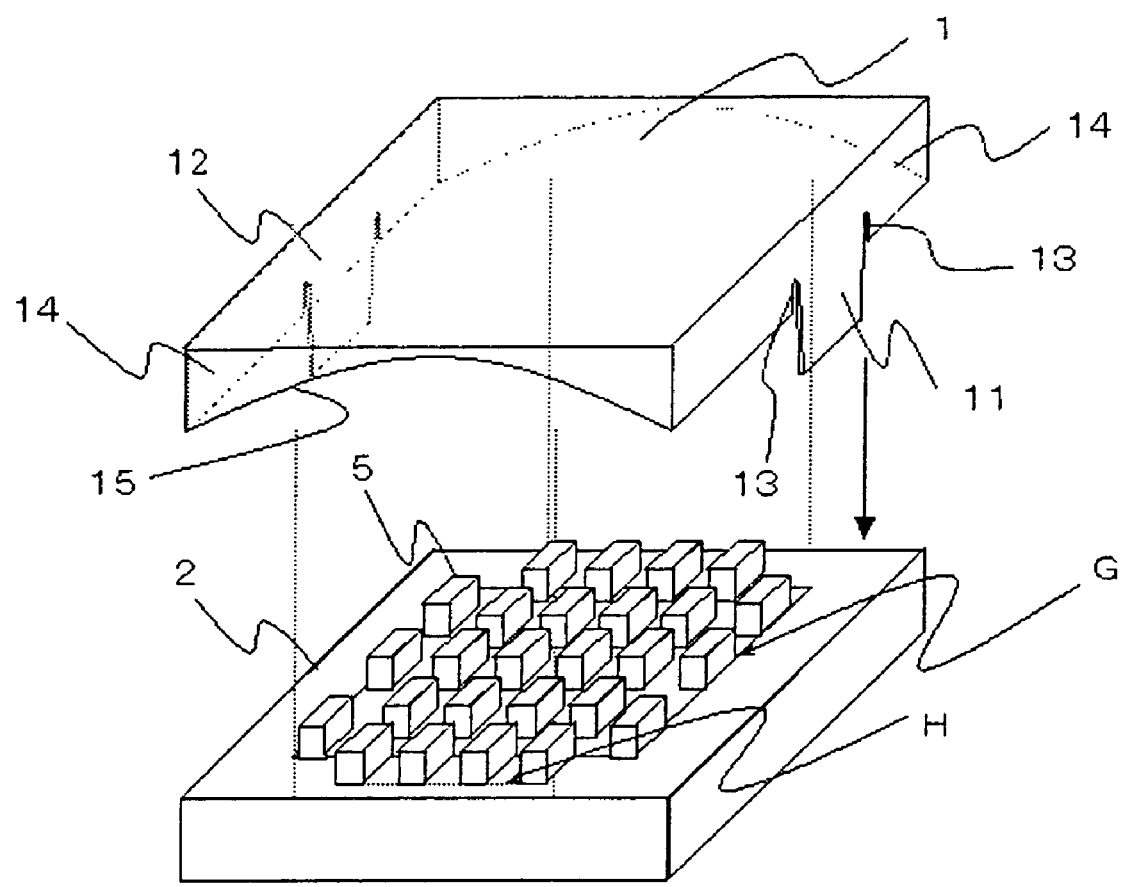
FIG. 5 is a schematic view showing a fourth example of the radio frequency device according to the second embodiment of the present invention.

In the second embodiment, while the open parts of the side surfaces of the metal shielding cap 5 are the central parts of the side surfaces in FIG. 2, similar effects are obtained with a structure having the open parts 15 in the diagonal positions as shown in FIG. 3 or a structure having the non-grounded side walls 14 in the central parts as shown in FIG. 4. Further, by making arch-shaped the open parts 15 of the side surfaces of the metal shielding cap 1 as shown in FIG. 5, increase in the number of radio frequency circuit parts 5 mounted on the dielectric multilayer circuit board 2 or miniaturization of the radio frequency device can be realized while the strength against forces from the direction of the top surface of the metal shielding cap 1 is maintained.

While one pair of grounded side walls 11 are provided in the first embodiment and the second embodiment, the number of grounded side walls 11 may be one or more than one.

Moreover, in the second embodiment, the length of the grounded side wall 11 and the non-grounded side walls 14 on one side surface of the metal shielding cap 1 is described as varying in two steps of large and small. However, this is merely an example; the length may vary in more than two steps, or may continuously vary in the middle, that is, may continuously vary from the grounded side wall 11 to the non-grounded side walls 14.

(Third Embodiment)

Next, a third embodiment of the present invention will be described.

According to the third embodiment of the present invention, in the radio frequency device shown in FIG. 2, radio frequency circuit parts 5 whose impedances are sensitively affected by the distance from the metal shielding cap 1 adjoining the non-grounded side walls 14 of the metal shielding cap 1, for example, chip coils are disposed in the parts of the non-grounded side walls 14 of the metal shielding cap 1 that are opened so that the radio frequency circuit parts 5 are not in contact.

Figure 9:
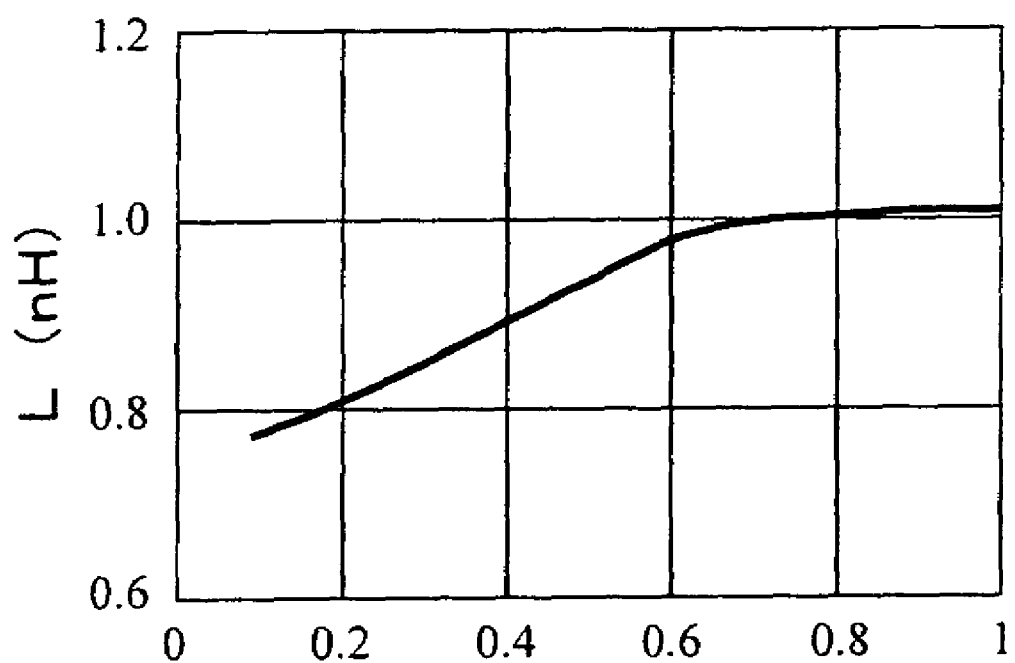
FIG. 9 is a characteristic view showing variations in the inductance value of a chip coil when a metal shielding cap and the chip coil are brought close to each other.

FIG. 9 shows variations in the inductance value of a chip coil (chip inductor) as a radio frequency circuit part 5 when the metal shielding cap 1 is brought near to the chip coil. Although depending on the pattern structure and directivity of the chip coil, the inductance value of the chip coil when the metal shielding cap 1 comes to a position next to the chip coil at a distance of 0.80 to 0.10 mm from the chip coil varies by approximately 20% in the case of the one with a nominal value of 1 nH. This inductance value variation becomes a cause of degradation of the characteristics of the radio frequency device.

The third embodiment of the present invention enables the avoidance of the influence of the variations in the distance between the radio frequency circuit parts 5 and the metal shielding cap 1 on the impedances of the radio frequency circuit parts 5 caused by variations in the mounting position accuracies of the radio frequency circuit parts 5 and the metal shielding cap 1 and the dimensional accuracies of the dielectric multilayer circuit board 2 and the metal shielding cap 1 which influence is present in the prior art radio frequency device.

As described above, according to the third embodiment of the present invention, by disposing the radio frequency circuit parts 5 whose characteristics are particularly affected when the metal shielding cap 1 is brought near thereto, in the open parts 15 formed by opening the side surfaces of the metal shielding cap 1 so that the radio frequency circuit parts 5 are not in contact, a radio frequency device can be provided that is small in size and has stable characteristics not affected by the metal shielding cap 1.

(Fourth Embodiment)

Next, a fourth embodiment of the present invention will be described.

According to the fourth embodiment of the present invention, in a structure using the non-grounded side walls 14 of the metal shielding cap 1 as supports for securing the space for placing the radio frequency circuit parts 5 between the metal shielding cap 1 and the dielectric multilayer circuit board 2 in the radio frequency device shown in FIG. 2, a structure circuit-designed as follows is provided: In a structure where the open part 15 having a height and width such that the radio frequency circuit parts 5 are not in contact is formed in a central part of each of the side surfaces of the metal shielding cap 1 and the parts on both sides thereof (non-grounded side walls 14) are left as supports, DC power circuit parts and the radio frequency circuit parts 5 through which a low radio frequency signal power flows are disposed in the proximity of the open parts 15. The radio frequency circuit parts 5 through which a high radio frequency signal power flows are disposed in the proximity of the parts of the metal shielding cap 1 where the side walls are left.

As described above, according to the fourth embodiment, by disposing the radio frequency circuit parts 5 through which a high radio frequency signal power flows in the parts where the side walls are present and disposing the radio frequency circuit parts 5 through which a low radio frequency signal power flows in the parts where no side wall is present according to the presence or absence of the side walls of the metal shielding cap 1, the shielding characteristic the same as that of the prior art radio frequency device can be maintained and miniaturization can be achieved.

(Fifth Embodiment)

Next, a fifth embodiment of the present invention will be described.

Figure 6:
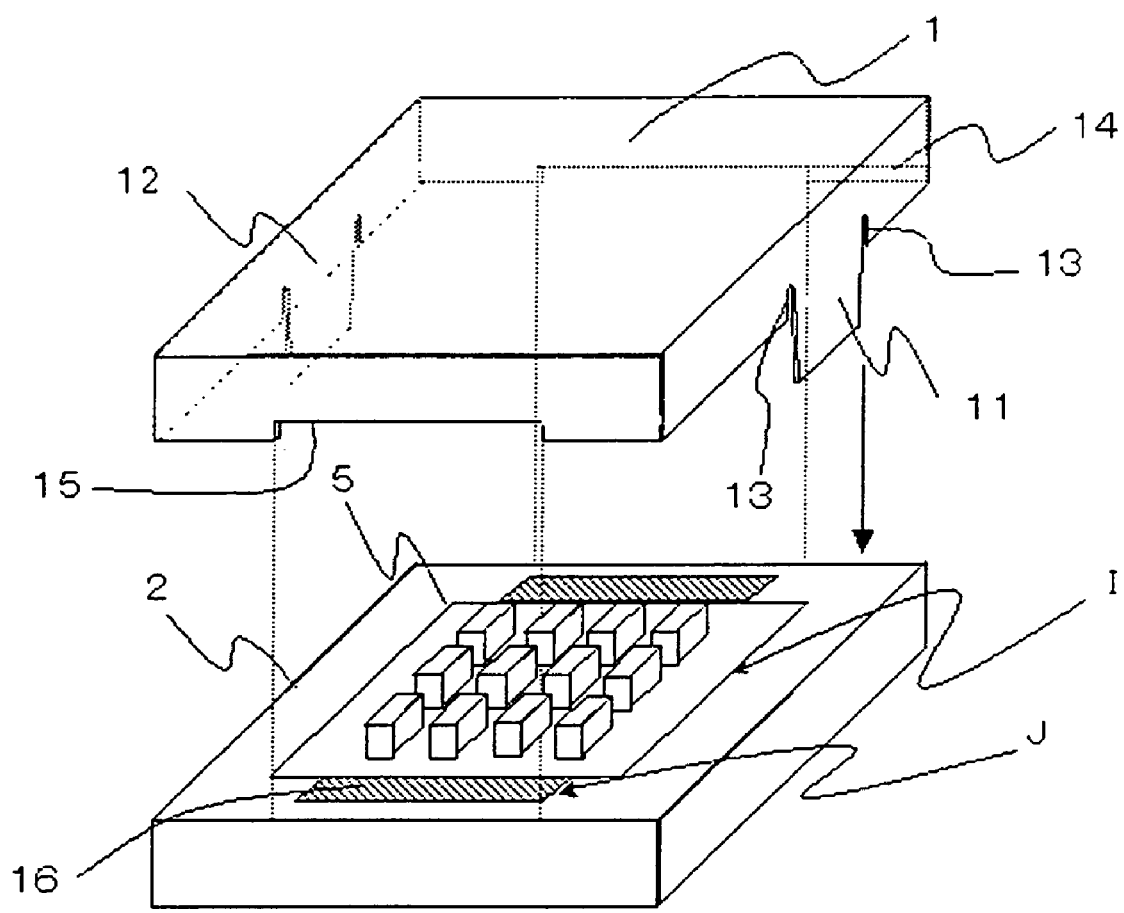
FIG. 6 is a schematic view showing an example of a radio frequency device according to a fifth embodiment of the present invention.

FIG. 6 shows the structure of the fifth embodiment of the present invention. As shown in FIG. 6, the structure of the fifth embodiment is similar to the structure described in the second embodiment. The radio frequency device of FIG. 6 has a structure such that the open parts 15 of the non-grounded side walls 14 of the metal shielding cap 1 are opened by a height of 0.050 to 0.150 mm so as not to be in contact with transmission lines 16 such as strip lines disposed on the surface of the dielectric multilayer circuit board. Except this, the structure is similar to that of the second embodiment. In FIG. 6, the solid line I indicates the transmission line groundable region in the prior art, and the solid line J indicates the transmission line groundable region increased by the fifth embodiment.

In the prior art radio frequency device, it is necessary to provide a distance of 0.400 mm between the sides of the dielectric multilayer circuit board 2 and the transmission lines 16 in order that the metal shielding cap 1 is not in contact with the transmission lines 16. However, in the fifth embodiment of the present invention, since it is unnecessary to consider the influence with respect to the metal shielding cap 1 (the same as that described in the first embodiment), only a distance of 0.200 mm is necessarily provided between the sides of the dielectric multilayer circuit board 2 and the transmission lines 16.

As described above, according to the fifth embodiment of the present invention, by providing the radio frequency device with the structure such that the non-grounded side walls 14 of the metal shielding cap 1 are opened so that the transmission lines 16 are not in contact, increase in the footprint of the transmission lines 16 on the dielectric multilayer circuit board 2 or miniaturization of the radio frequency device can be realized.

While description is given using the dielectric multilayer circuit board 2 in the above-described embodiments, the circuit board 2 may be a normal circuit board.

What is claimed is:

1. A radio frequency device comprising:
   a circuit board having a ground pattern on a surface thereof;
   a radio frequency circuit part and a transmission line disposed on a top surface of said circuit board; and
   a metal shielding cap fixed to said circuit board so as to cover said radio frequency circuit part and said transmission line, wherein:
   said metal shielding cap comprises: a top plate disposed above said radio frequency circuit part and substantially parallel to said circuit board; a grounded side wall being provided so as to hang down from a part of an edge of said top plate, having a spring property and being joined to said ground pattern of said circuit board so as to be electrically connected thereto; and a non-grounded side wall provided so as to adjoin said grounded side wall, to hang down from another part of the edge of said top plate and to be shorter than said grounded side wall, a notch opened downward is provided at a boundary between said grounded side wall and said non-grounded side wall, and a side wall of said metal shielding cap is open except for said grounded side wall and said non-grounded side wall,
   said non-grounded side wall has a length larger than a height of said radio frequency circuit part, and said grounded side wall is joined to said ground pattern of said circuit board with a lower end of said non-grounded side wall abutting on the top surface of said circuit board,
   said opened part of a side surface of said metal shielding cap has a height and width set so that said metal shielding cap is not in contact with said radio frequency circuit part disposed on said circuit board, and
   a radio frequency circuit part whose impedance is sensitively affected by a distance from said metal shielding cap is disposed in the opened part of the side surface of the metal shielding cap.

2. A radio frequency device comprising:
   a circuit board having a ground pattern on a surface thereof;
   a radio frequency circuit part and a transmission line disposed on a top surface of said circuit board; and
   a metal shielding cap fixed to said circuit board so as to cover said radio frequency circuit part and said transmission line, wherein:
   said metal shielding cap comprises: a top plate disposed above said radio frequency circuit part and substantially parallel to said circuit board; a grounded side wall being provided so as to hang down from a part of an edge of said top plate, having a spring property and being joined to said ground pattern of said circuit board so as to be electrically connected thereto; and a non-grounded side wall provided so as to adjoin said grounded side wall, to hang down from another part of the edge of said top plate and to be shorter than said grounded side wall, a notch opened downward is provided at a boundary between said grounded side wall and said non-grounded side wall, and a side wall of said metal shielding cap is open except for said grounded side wall and said non-grounded side wall,
   said non-grounded side wall has a length larger than a height of said radio frequency circuit part, and said grounded side wall is joined to said ground pattern of said circuit board with a lower end of said non-grounded side wall abutting on the top surface of said circuit board,
   said opened part of a side surface of said metal shielding cap has a height and width set so that said metal shielding cap is not in contact with said radio frequency circuit part disposed on said circuit board,
   said opened part of the side surface of said metal shielding cap is arch-shaped, and
   a radio frequency circuit part whose impedance is sensitively affected by a distance from said metal shielding cap is disposed in the opened part of the side surface of the metal shielding cap.

3. A radio frequency device comprising:
   a circuit board having a ground pattern on a surface thereof;
   a radio frequency circuit part and a transmission line disposed on a top surface of said circuit board; and
   a metal shielding cap fixed to said circuit board so as to cover said radio frequency circuit part and said transmission line, wherein:
   said metal shielding cap comprises: a top plate disposed above said radio frequency circuit part and substantially parallel to said circuit board; a grounded side wall being provided so as to hang down from a part of an edge of said top plate, having a spring property and being joined to said ground pattern of said circuit board so as to be electrically connected thereto; and a non-grounded side wall provided so as to adjoin said grounded side wall, to hang down from another part of the edge of said top plate and to be shorter than said grounded side wall, a notch opened downward is provided at a boundary between said grounded side wall and said non-grounded side wall, and a side wall of said metal shielding cap is open except for said grounded side wall and said non-grounded side wall, said non-grounded side wall has a length larger than a height of said radio frequency circuit part, and said grounded side wall is joined to said ground pattern of said circuit board with a lower end of said non-grounded side wall abutting on the top surface of said circuit board, said opened part of a side surface of said metal shielding cap has a height and width set so that said metal shielding cap is not in contact with said radio frequency circuit part disposed on said circuit board, and a radio frequency circuit part for low power through which a low radio frequency signal power flows is disposed in a position in a proximity of the opened part of the side surface of the metal shielding cap, and a radio frequency circuit part for high power through which a high radio frequency signal power flows is disposed in a position in a proximity of the non-opened part of the side surface of the metal shielding cap.

4. A radio frequency device comprising:

a circuit board having a ground pattern on a surface thereof;

a radio frequency circuit part and a transmission line disposed on a top surface of said circuit board; and a metal shielding cap fixed to said circuit board so as to cover said radio frequency circuit part and said transmission line, wherein:

said metal shielding cap comprises: a top plate disposed above said radio frequency circuit part and substantially parallel to said circuit board; a grounded side wall being provided so as to hang down from a part of an edge of said top plate, having a spring property and being joined to said ground pattern of said circuit board so as to be electrically connected thereto; and a non-grounded side wall provided so as to adjoin said grounded side wall, to hang down from another part of the edge of said top plate and to be shorter than said grounded side wall, a notch opened downward is provided at a boundary between said grounded side wall and said non-grounded side wall, and a side wall of said metal shielding cap is open except for said grounded side wall and said non-grounded side wall, said non-grounded side wall has a length larger than a height of said radio frequency circuit part, and said grounded side wall is joined to said ground pattern of said circuit board with a lower end of said non-grounded side wall abutting on the top surface of said circuit board, said opened part of a side surface of said metal shielding cap has a height and width set so that said metal shielding cap is not in contact with said radio frequency circuit part disposed on said circuit board, said opened part of the side surface of said metal shielding cap is arch-shaped, and a radio frequency circuit part for low power through which a low radio frequency signal power flows is disposed in a position in a proximity of the opened part of the side surface of the metal shielding cap, and a radio frequency circuit part for high power through which a high radio frequency signal power flows is disposed in a position in a proximity of the non-opened part of the side surface of the metal shielding cap.

* * * * *